(12) United States Patent
Choi et al.

(10) Patent No.: US 7,968,000 B2
(45) Date of Patent: Jun. 28, 2011

(54) ETCHANT COMPOSITION, AND METHOD OF FABRICATING METAL PATTERN AND THIN FILM TRANSISTOR ARRAY PANEL USING THE SAME

(75) Inventors: Young-Joo Choi, Jeollanam-do (KR);
Bong-Kyun Kim, Incheon-si (KR);
Byeong-Jin Lee, Seoul (KR);
Jong-Hyun Choung, Hwaseong-si (KR); Sun-Young Hong, Yongin-si (KR); Nam-Seok Suh, Yongin-si (KR);
Hong-Sick Park, Suwon-si (KR);
Ky-Sub Kim, Jeonju-si (KR);
Seung-Yong Lee, Daejeon (KR);
Joon-Woo Lee, Jeonju-si (KR);
Young-Chul Park, Iksan-si (KR);
Young-Jun Jin, Iksan-si (KR);
Seung-Jae Yang, Jeonju-si (KR);
Hyun-Kyu Lee, Iksan-si (KR);
Sang-Hoon Jang, Jeonju-si (KR);
Min-Ki Lim, Iksan-si (KR)

(73) Assignees: Samsung Electronics, Co., Ltd., Suwon-Si (KR); Dongwoo Fine-Chem Co., Ltd., Iksan-Si (KR)

( * ) Notice: Subject to any disclaimer, the term of this patent is extended or adjusted under 35 U.S.C. 154(b) by 14 days.

(21) Appl. No.: 12/432,437

(22) Filed: Apr. 29, 2009

(65) Prior Publication Data

US 2010/0120209 A1    May 13, 2010

(30) Foreign Application Priority Data

Nov. 7, 2008  (KR) .......................... 10-2008-0110435

(51) Int. Cl.
*C09K 13/00* (2006.01)
*C03C 15/00* (2006.01)
(52) U.S. Cl. ..................... 252/79.1; 252/79.2; 252/79.4; 216/103; 216/106
(58) Field of Classification Search ................ 252/79.1, 252/79.2, 79.4; 216/103, 106
See application file for complete search history.

(56) References Cited

U.S. PATENT DOCUMENTS

| 4,410,393 | A | * | 10/1983 | Russell et al. ................. 216/33 |
| 5,885,888 | A | * | 3/1999 | Konuma et al. ............... 438/585 |
| 6,159,865 | A | * | 12/2000 | Kezuka et al. ................ 438/745 |
| 2005/0092620 | A1 | * | 5/2005 | Mavliev et al. ............... 205/662 |
| 2009/0004863 | A1 | * | 1/2009 | Kamimura .................... 438/692 |

* cited by examiner

*Primary Examiner* — Binh X Tran
(74) *Attorney, Agent, or Firm* — F. Chau & Associates, LLC

(57) ABSTRACT

An etchant composition is provided. The etchant composition includes about 40 to about 65 wt % of phosphoric acid, about 2 to about 5 wt % of nitric acid, about 2 to about 20 wt % of acetic acid, about 0.1 to about 2 wt % of a compound containing phosphate, about 0.1 to about 2 wt % of a compound simultaneously containing an amino group and a carboxyl group, and a remaining weight percent of water for the total weight of the composition.

20 Claims, 20 Drawing Sheets

ETCHANT COMPOSITION, AND METHOD OF FABRICATING METAL PATTERN AND THIN FILM TRANSISTOR ARRAY PANEL USING THE SAME

CROSS-REFERENCE TO RELATED APPLICATION

This application claims priority to Korean Patent Application No. 10-2008-0110435 filed on Nov. 7, 2008, the entire disclosure of which is hereby incorporated by reference herein in its entirety.

BACKGROUND (a) Technical Field

The present disclosure relates to an etchant composition, and to a method of fabricating a metal pattern and a thin film transistor array panel.

(b) Description of the Related Art

In recent times, there has been an increase in the amount of the usage of flat panel displays, such as, for example, a liquid crystal display, a plasma display device, an electrophoretic display, and an organic electroluminescence device.

Such a display device may be provided with a thin film transistor, which may be connected to gate and data lines crossing each other in an insulated manner.

Scan signals (or gate signals), such as a gate-on voltage and a gate-off voltage, may be input through the gate line, and display signals (or data signals) may be output through the data line.

As the display device is enlarged in dimension, the length of wiring lines like the gate and data lines may also increase therewith. With an increase in the length of the wiring lines and resistance thereof, it may be necessary to lower the heightened resistance of the wiring lines so as to properly transmit signals therethrough.

Furthermore, the thickness or width of the wiring lines should be enlarged so as to lower the resistance of the wiring lines. However, certain difficulties may be encountered with the enlarged thickness thereof such that a stepped difference may be made due to the thickness enlargement and other wiring lines placed over the enlarged wiring lines may be broken due to the stepped difference. Consequently with the enlarged width thereof, the aperture ratio may be reduced.

SUMMARY

Exemplary embodiments of the present invention may provide an etchant composition and a method of fabricating a metal pattern and a thin film transistor array panel having the benefits of ensuring good etching characteristics of wiring lines.

In accordance with an exemplary embodiment of the present invention, an etchant composition is provided. The etchant composition includes about 40 to about 65 wt % of phosphoric acid, about 2 to about 5 wt % of nitric acid, about 2 to about 20 wt % of acetic acid, about 0.1 to about 2 wt % of a compound containing phosphate, about 0.1 to about 2 wt % of a compound simultaneously containing an amino group and a carboxyl group, and a remaining weight percent of water for the total weight of the composition.

The etchant composition may further include about 0.1 to about 2 wt % of an organic acid excluding acetic acid.

The organic acid excluding acetic acid may be at least one material selected from the group consisting of butanoic acid, citric acid, formic acid, gluconic acid, glycolic acid, malonic acid, oxalic acid, pentanoic acid, and a water-soluble organic acid excluding acetic acid.

The compound containing phosphate may be a material where one, two, or three hydrogen atoms in phosphoric acid are substituted by alkali metals or alkali earth metals.

The compound containing phosphate may be at least one material selected from the group consisting of sodium dihydrogen phosphate and potassium dihydrogen phosphate.

The compound simultaneously containing an amino group and a carboxyl group may be at least one material selected from an alanine-based compound, an aminobutyric acid-based compound, a glutamic acid-based compound, a glycine-based compound, an iminodiacetic acid-based compound, a nitrilotriacetic acid-based compound, and a sarcosine-based compound.

The etchant composition may etch a single-layered structure based on copper or a copper alloy and a multi-layered structure of two or more layers based on the copper or copper alloy.

The etchant composition may further include at least one material selected from the group consisting of an etch control agent, a surfactant, a metal ion sequestering agent, a corrosion inhibitor, and a pH control agent.

The water is preferably deionized water.

In accordance with another exemplary embodiment of the present invention, a method of forming a metal pattern is provided. The method includes the steps of depositing a metal layer including copper or a copper alloy, forming a photoresist pattern on the metal layer, etching the metal layer by using the photoresist pattern as a mask, and removing the photoresist pattern. The step of etching the metal layer is conducted using an etchant composition including about 40 to about 65 wt % of phosphoric acid ($H_3PO_4$), about 2 to about 5 wt % of nitric acid ($HNO_3$), about 2 to about 20 wt % of acetic acid ($CH_3COOH$), about 0.1 to about 2 wt % of a compound containing phosphate, about 0.1 to about 2 wt % of a compound simultaneously containing an amino group and a carboxyl group, and a remaining weight percent of water for the total weight of the composition.

The etching composition may further include about 0.1 to about 2 wt % of an organic acid excluding acetic acid.

The organic acid excluding acetic acid may be at least one material selected from the group consisting of butanoic acid, citric acid, formic acid, gluconic acid, glycolic acid, malonic acid, oxalic acid, pentanoic acid, and a water-soluble organic acid excluding acetic acid.

The compound containing phosphate may be a material where one, two, or three hydrogen atoms in phosphoric acid are substituted by alkali metals or alkali earth metals.

The compound containing phosphate may be at least one material selected from the group consisting of sodium dihydrogen phosphate and potassium dihydrogen phosphate.

The compound simultaneously containing an amino group and a carboxyl group may be at least one material selected from an alanine-based compound, an aminobutyric acid-based compound, a glutamic acid-based compound, a glycine-based compound, an iminodiacetic acid-based compound, a nitrilotriacetic acid-based compound, and a sarcosine-based compound.

The etchant composition may etch a single-layered structure based on copper or a copper alloy and a multi-layered structure of two or more layers based on the copper or copper alloy.

The etchant composition may further include at least one material selected from the group consisting of an etch control agent, a surfactant, a metal ion sequestering agent, a corrosion inhibitor, and a pH control agent.

The water is preferably deionized water.

In another exemplary embodiment of the present invention, a method of fabricating a thin film transistor array panel is provided. The method includes the steps of forming gate lines on an insulation substrate, forming data lines crossing the gate lines and having source electrodes, and drain electrodes facing the source electrodes, forming a semiconductor layer around the source and drain electrodes, and forming pixel electrodes contacting the drain electrodes. With at least one of the steps of forming the gate lines and forming the data lines, a metal layer including copper or a copper alloy is deposited onto the insulation substrate, and the metal layer is etched by using an etchant composition including about 40 to about 65 wt % of phosphoric acid ($H_3PO_4$), about 2 to about 5 wt % of nitric acid ($HNO_3$), about 2 to about 20 wt % of acetic acid ($CH_3COOH$), about 0.1 to about 2 wt % of a compound containing phosphate, about 0.1 to about 2 wt % of a compound simultaneously containing an amino group and a carboxyl group, and a remaining weight percent of water for the total weight of the composition.

With the step of forming the gate lines, a metal layer including copper or a copper alloy is deposited onto the insulation substrate, and the metal layer is etched by using an etchant composition including about 40 to about 65 wt % of phosphoric acid ($H_3PO_4$), about 2 to about 5 wt % of nitric acid ($HNO_3$), about 2 to about 20 wt % of acetic acid ($CH_3COOH$), about 0.1 to about 2 wt % of a compound containing phosphate, about 0.1 to about 2 wt % of a compound simultaneously containing an amino group and a carboxyl group, and a remaining weight percent of water for the total weight of the composition, thereby forming the gate lines or the data lines. Then, a photoresist film is coated onto the gate lines. The photoresist film is exposed to light illuminated from the rear of the insulation substrate by using the metal layer as a mask and developed to thereby form a photoresist pattern. Heat or light is then applied to the photoresist pattern.

The etchant composition may further include about 0.1 to about 2 wt % of an organic acid excluding acetic acid.

With the usage of an etchant composition according to an exemplary embodiment of the present invention, the metal wires of a single-layered structure based on copper or a copper alloy or a multi-layered structure of two or more layers based on the metal of copper or a copper alloy can be simultaneously etched with process stability and good etch profiles.

Furthermore, the etchant composition may exhibit excellent productivity in that it may have uniform etching characteristics without damaging the underlying layer components, and it may be applicable to a large area substrate without damaging the device.

In addition, the etchant composition may serve to form low resistance wires of a thin film transistor array panel without causing breakage of the wires or reducing the aperture ratio.

BRIEF DESCRIPTION OF THE DRAWINGS

Exemplary embodiments of the present invention can be understood in more detail from the following description taken in conjunction with the attached drawings in which.

DETAILED DESCRIPTION OF THE EXEMPLARY EMBODIMENTS OF THE INVENTION

Figure 1A:
FIG. 1A to FIG. 1D are sectional SEM photographs of a Cu layer etched at about 30° C. using an etchant composition according to Example 8.
Figure 1B:
Figure 1C:
Figure 1D:
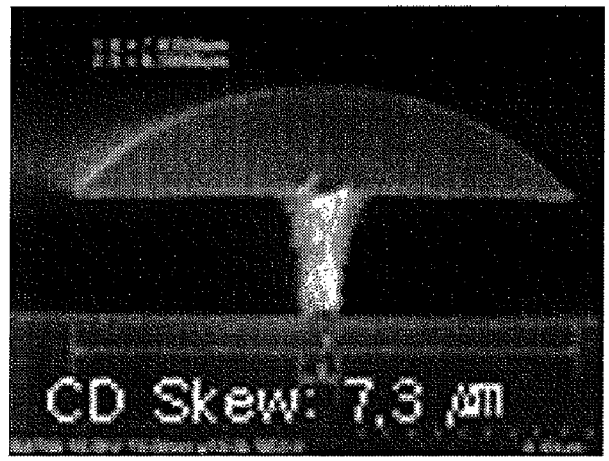

The present invention will be described more fully hereinafter with reference to the accompanying drawings, in which exemplary embodiments of the invention are shown.

The merits and features of the present invention, and the method of achieving them, will be clearly understood by way of the exemplary embodiments to be described in detail with reference to the accompanying drawings. However, as those skilled in the art would realize, the described embodiments may be modified in various different ways, all without departing from the spirit or scope of the present invention. The exemplary embodiments disclosed in this detailed description are only for enhancement of understanding of the present invention, and it is to be understood that the invention is not limited to the disclosed embodiments, but, on the contrary, is intended to cover various modifications and equivalent arrangements included within the spirit and scope of the appended claims.

An etchant composition according to an exemplary embodiment of the present invention will now be described in detail.

An etchant composition according to an exemplary embodiment of the present invention includes, for example, about 40 to about 65 wt % of phosphoric acid ($H_3PO_4$), about 2 to about 5 wt % of nitric acid ($HNO_3$), about 2 to about 20 wt % of acetic acid ($CH_3COOH$), about 0.1 to about 2 wt % of an organic acid excluding acetic acid, about 0.1 to about 2 wt % of a compound containing phosphate, about 0.1 to about 2 wt % of a compound simultaneously containing an amino group and a carboxyl group, and the remaining weight percent of water for the total weight of the composition.

The phosphoric acid may etch copper and a copper alloy as a main oxidizing agent. The content of the phosphoric acid is, for example, about 40 wt % to about 65 wt % by total weight of the composition. In the case where the content of the phosphoric acid is less than about 40 wt %, the copper etching speed may be lowered or non-uniform etching may be made so that the desired etching characteristics may not be obtained. By contrast, in the case where the content of the phosphoric acid exceeds about 65 wt %, the chemical wettability of a photosensitive film may become heightened, and as a result, the end portion of the photosensitive film may be lifted or curled up. In the case where the photosensitive film curls up at the end thereof, a gap may be made between the end of the photosensitive film and the metals of copper and copper alloy contacting the photosensitive film, and the etchant may over flow in through the gap so that the target may be partially over-etched. In such a case, the one-sided critical dimension between the over-etched portion and the non-overetched portion may be enlarged, and the aspect ratio, the etch depth, and the etch time may be altered. Furthermore, the line width of the copper and the copper alloy film patterns may be reduced so that the desired resistance characteristics may not be obtained.

The nitric acid functions as an oxidizing agent, and has a role of controlling the etch speed, the etch depth, and the aspect ratio, together with phosphoric acid. The content of the nitric acid is, for example, about 2 wt % to about 5 wt % by total weight of the composition. In the case where the content of the nitric acid is less than about 2 wt %, the copper etching speed may be lowered, or non-uniform etching may occur so that stains or spots are generated. By contrast, in the case where the content of the nitric acid exceeds about 5 wt %, the photosensitive film may peel off. With the peeling off of the photosensitive film, the underlying metal layer may be over-etched so that the wiring is broken, or it may become difficult for the layer to properly function as an electrode.

The acetic acid also functions as an oxidizing agent, and the content thereof is, for example, about 2 wt % to about 20 wt % by total weight of the composition. In the case where the content of the acetic acid is less than about 2 wt %, the copper etching may not be made fluently so that copper remnants may be partially produced in the substrate. In the case where the content of the acetic acid exceeds about 20 wt %, the copper metal may be over-etched so that uniform etching characteristics may not be obtained.

The organic acid excluding acetic acid functions as a subsidiary oxidizing agent for oxidizing the copper metal, and the content thereof is, for example, about 0.1 wt % to about 2 wt % by total weight of the composition. In the case where the content of the organic acid is less than about 0.1 wt %, copper remnants may be partially produced, while in case where the content of the organic acid exceeds about 2 wt %, the copper metal may be over-etched.

The organic acid excluding acetic acid may be at least one material selected from, for example, butanoic acid, citric acid, formic acid, gluconic acid, glycolic acid, malonic acid, oxalic acid, pentanoic acid, and a water-soluble organic acid excluding acetic acid.

The compound containing phosphate controls the copper etching speed, and the content thereof is about 0.1 wt % to about 2 wt % by total weight of the composition. In the case where the content of the compound containing phosphate is less than about 0.1 wt %, it may not properly function as a copper etching speed control agent. By contrast, in case the content of the phosphate-contained compound exceeds about 2 wt %, the copper etching speed may be lowered so that copper remnants may be produced, and non-uniform etching characteristics result.

The phosphate-contained compound is, for example, a salt where one, two, or three hydrogen atoms in phosphoric acid are substituted by alkali metals or alkali earth metals, and may be at least one material selected from, for example, sodium dihydrogen phosphate and potassium dihydrogen phosphate.

The compound simultaneously containing an amino group and a carboxyl group also controls the copper etching speed, and the content thereof is about 0.1 wt % to about 2 wt % by total weight of the composition. In the case where the content of the compound simultaneously containing the amino group and carboxyl group is less than about 0.1 wt %, the copper etching speed may not be controlled so that over-etching may occur. In the case where the content of the compound simultaneously containing the amino group and carboxyl group exceeds about 2 wt %, the copper etching speed may be lowered so that the etch time may be increased and difficulties associated with productivity may result.

The compound simultaneously containing the amino group and carboxyl group may be at least one material selected from, for example, the compounds based on alanine, aminobutyric acid, glutamic acid, glycine, iminodiacetic acid, nitrilotriacetic acid, and sarcosine.

The etchant composition according to an exemplary embodiment of the present invention may further include at least one material selected from, for example, an etch control agent, a surfactant, a metal ion sequestering agent, a corrosion inhibitor, and a pH control agent.

With an exemplary embodiment of the present invention, deionized water is preferably used as the water content, and the deionized water more preferably has resistivity of about 18 MΩ/cm or more, which is well adapted for use in the semiconductor fabrication process.

The present invention will be described more fully hereinafter by way of examples and comparative examples, but it is to be understood that the examples are only for enhancement of understanding of the present invention, and the invention is not limited to those examples.

Examples will be now described with reference to FIG. 1A to FIG. 12C.

EXAMPLES

A display panel with metal wiring layers containing copper or a copper alloy was fabricated.

A substrate based on a glass material with a size of about 300× about 400 mm was prepared, and metal layers containing copper or a copper alloy were deposited onto the substrate as gate and data lines. A photoresist pattern was formed on the metal layers.

An etchant composition of about 180 kg containing phosphoric acid ($H_3PO_4$), nitric acid ($HNO_3$), acetic acid ($CH_3COOH$), glycolic acid, sodium dihydrogen phosphate, iminodiacetic acid, and water in accordance with the composition ratios listed in Table 1 was prepared. The etchant composition was put into experimental spray etching equipment (manufactured by K. C Tech Company, model ETCHER (TFT)), and the etching process was conducted at about 30° C., about 33° C., and about 35° C. The total etch time was established such that the time detected by an end point detector (EPD) was added by the amounts of about 50%, about 70%, about 90%, and about 110%, respectively. The substrate was put into the etching equipment and sprayed. When the etching with respect to the gate and data lines was completed, the substrate was taken out and cleaned with deionized water. The etching profile was observed by a scanning electronic microscope (SEM, manufactured by HITACHI Company, model S-4700), and the total time detected by the end point detector (for convenience, referred to hereinafter simply as EPD), the one-sided critical dimension loss (for convenience, referred to hereinafter simply as CD skew), and the presence or absence of remnants after the etching were evaluated. Thereafter, the substrate was dried by using a hot air dryer, and the photoresist was stripped by using a photoresist stripper. After the cleaning and the drying, the etching profile was again observed, and the EPD, the CD skew, the taper angle, and the presence or absence of remnants after the etching were evaluated.

((Etching characteristic result standard))

◎ (Excellent): EPD≦about 70 sec, CD skew≦about 2 μm, Taper angle=about 70-about 90 degrees ○ (Good): EPD≦about 75 sec, CD skew≦about 3 μm, Taper angle=about 60-about 70 degrees Δ(Fair): EPD≦about 80 sec, CD skew≦about 4 μm, Taper angle=about 50-about 60 degrees x (Poor): EPD≦about 80 sec, CD skew>about 4 μm, Taper angle<about 50 degrees The results based on the above-identified standards are listed in Table 1.

FIG. 1A to FIG. 6C are sectional SEM photographs of a Cu layer and a CuO/Cu layer after the etching process was completed.

FIG. 1A to FIG. 1D are sectional SEM photographs of a Cu layer etched at about 30° C. by using an etchant composition according to Example 8, and FIG. 2A to FIG. 2D are sectional SEM photographs of a CuO/Cu layer etched at about 30° C. by using an etchant composition according to Example 8.

FIG. 1A to FIG. 1D illustrate the profiles of a Cu wiring layer after it was etched by using an etchant composition containing phosphoric acid, nitric acid, acetic acid, glycolic acid, sodium dihydrogen phosphate, iminodiacetic acid, and water in the weight percent (wt %) ratio of about 60, about 3, about 12, about 1.0, about 2.0, about 2.0, and about 20. First, it turned out that the Cu layer was good in EPD at about 73 sec. With the case of FIG. 1A based on EPD+ about 50%, it turned out that the Cu layer was fair in CD skew at about 3.5 μm. With the case of FIG. 1B based on EPD+ about 70%, the CD skew of the Cu layer turned out to be about 5.0 μm, while with the case of FIG. 1C based on EPD+ about 90%, the CD skew thereof was about 7.1 μm, and with the case of FIG. 1D based on EPD+ about 110%, the CD skew was about 7.3 μm. Furthermore, with all the relevant cases, etching remnants were not found.

FIG. 2A to FIG. 2D illustrate the profiles of a CuO/Cu wiring layer after it was etched by using an etchant composition containing phosphoric acid, nitric acid, acetic acid, glycolic acid, sodium dihydrogen phosphate, iminodiacetic acid, and water in the weight percent (wt %) ratio of about 60, about 3, about 12, about 1.0, about 2.0, about 2.0, and about 20. First, it turned out that the CuO/Cu layer was excellent in total etch time at about 69 sec. With the case of FIG. 2A based on EPD+ about 50%, it turned out that the CuO/Cu layer was fair in CD skew at about 3.1 μm. With the case of FIG. 2B based on EPD+ about 70%, the CD skew of the CuO/Cu layer turned out to be about 3.7 μm, while with the case of FIG. 2C

TABLE 1

| | Composition (wt %) | | | | | | | Etching characteristic result | | | |
| --- | --- | --- | --- | --- | --- | --- | --- | --- | --- | --- | --- |
| Ex. | Phosphoric acid | Nitric acid | Acetic acid | Glycolic acid | Sodium dihydrogen phosphate | Iminodiacetic acid | Water | EPD | CD skew | Taper angle | Remnants |
| 1  | 45 | 4 | 15 | 2.0 | 0.7 | 0.5 | 32.8 | Δ | Δ | Δ | None |
| 2  | 47 | 3 | 20 | 1.0 | 0.3 | 0.7 | 28   | Δ | ○ | Δ | None |
| 3  | 48 | 5 | 18 | 0.8 | 0.7 | 1.0 | 26.5 | ○ | Δ | Δ | None |
| 4  | 48 | 7 | 20 | 0.5 | 0.5 | 0.5 | 23.5 | ○ | Δ | Δ | None |
| 5  | 50 | 3 | 20 | 1.0 | 0.7 | 0.7 | 24.6 | ○ | ○ | Δ | None |
| 6  | 52 | 3 | 20 | 2.0 | 0.5 | 0.5 | 22   | ○ | ○ | Δ | None |
| 7  | 55 | 4 | 20 | 1.5 | 1.5 | 2.0 | 16.0 | ◎ | ○ | ◎ | None |
| 8  | 60 | 3 | 12 | 1.0 | 2.0 | 2.0 | 20.0 | ◎ | ◎ | ◎ | None |
| 9  | 65 | 7 | 10 | 0.5 | 1.3 | 0.7 | 15.5 | ◎ | Δ | ○ | None |
| 10 | 68 | 4 | 10 | 1.0 | 1.5 | 1.5 | 14.0 | ◎ | Δ | ○ | None |
| 11 | 60 | 3 | 12 | 0.0 | 2.0 | 2.0 | 21.0 | ◎ | ○ | ○ | None |
| 12 | 60 | 3 | 12 | 1.0 | 0.0 | 2.0 | 22.0 | ○ | ○ | ○ | None |
| 13 | 60 | 3 | 12 | 1.0 | 2.0 | 0.0 | 22.0 | ○ | Δ | ○ | None |
| 14 | 60 | 3 | 12 | 0.0 | 0.0 | 2.0 | 23.0 | ○ | Δ | Δ | None |
| 15 | 60 | 3 | 12 | 0.0 | 2.0 | 0.0 | 23.0 | ◎ | ○ | Δ | None |
| 16 | 60 | 3 | 12 | 1.0 | 0.0 | 0.0 | 24.0 | ◎ | Δ | Δ | None |

(EX.: Example)

Figure 2A:
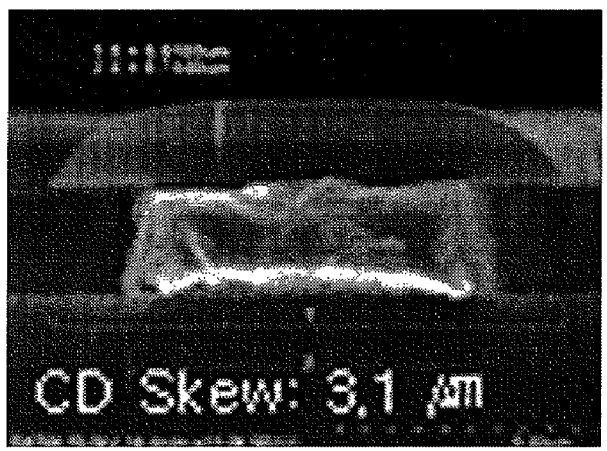
FIG. 2A to FIG. 2D are sectional SEM photographs of a CuO/Cu layer etched at about 30° C. using an etchant composition according to Example 8.
Figure 2B:
Figure 2C:
Figure 2D:
Figure 3A:
FIG. 3A to FIG. 3D are sectional SEM photographs of a Cu layer etched at about 33° C. using an etchant composition according to Example 8.
Figure 3B:
Figure 3C:
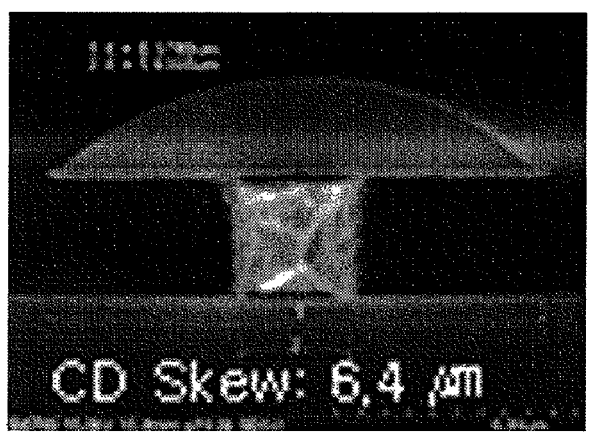
Figure 3D:
Figure 4A:
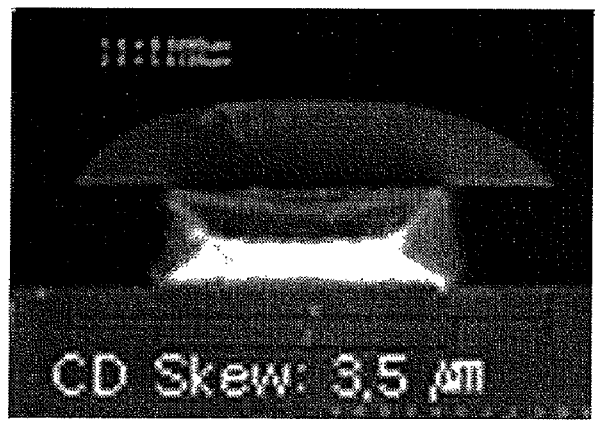
FIG. 4A to FIG. 4D are sectional SEM photographs of a CuO/Cu layer etched at 33° C. using an etchant composition according to Example 8.
Figure 4B:
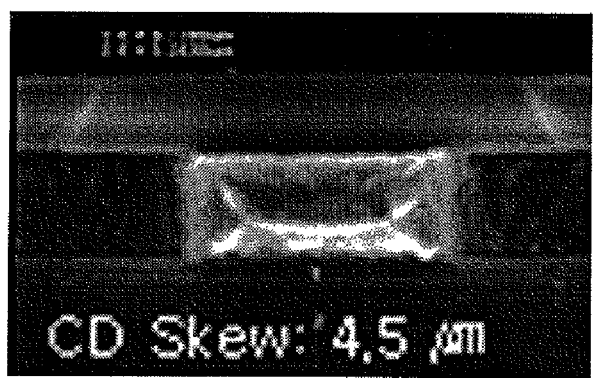
Figure 4C:
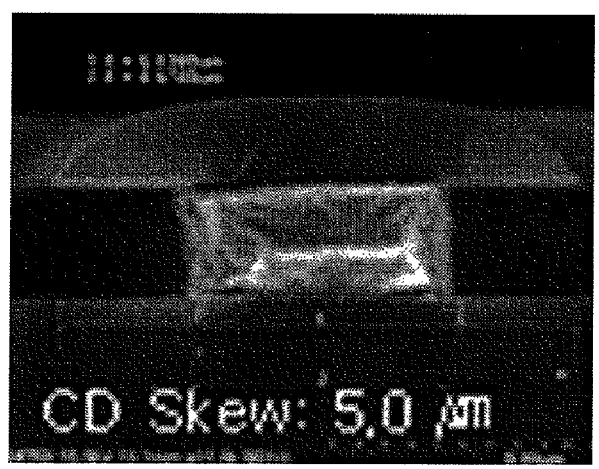
Figure 4D:

As known from Table 1, in case a plurality of metal layers were collectively etched using an etchant composition according to an exemplary embodiment of the present invention, the etching characteristics of Fair (Δ), Good (○), or Excellent (◎) could be obtained, and etching remnants were not found.

based on EPD+ about 90%, the CD skew thereof was about 5.3 μm, and with the case of FIG. 2D based on EPD+ about 110%, the CD skew was about 6.4 μm. Furthermore, with all the relevant cases, etching remnants were not found.

FIG. 3A to FIG. 3D are sectional SEM photographs of a Cu layer etched at about 33° C. by using an etchant composition according to Example 8, and FIG. 4A to FIG. 4D are sectional SEM photographs of a CuO/Cu layer etched at about 33° C. by using an etchant composition according to Example 8.

FIG. 3A to FIG. 3D illustrate the profiles of a Cu wiring layer after it was etched by using an etchant composition containing phosphoric acid, nitric acid, acetic acid, glycolic acid, sodium dihydrogen phosphate, iminodiacetic acid, and water in the weight percent (wt %) ratio of about 60, about 3, about 12, about 1.0, about 2.0, about 2.0, and about 20. First, it turned out that the Cu layer was excellent in EPD at about 62 sec. With the case of FIG. 3A based on EPD+ about 50%, it turned out that the CD skew of the Cu layer was fair at about 4.1 μm. With the case of FIG. 3B based on EPD+ about 70%, the CD skew of the Cu layer turned out to be about 5.2 μm, while with the case of FIG. 3C based on EPD+ about 90%, the CD skew thereof was about 6.4 μm, and with the case of FIG. 3D based on EPD+ about 110%, the CD skew thereof was about 7.5 μm. Furthermore, with all the relevant cases, etching remnants were not found.

FIG. 4A to FIG. 4D illustrate the profiles of a CuO/Cu wiring later after it was etched by using an etchant composition containing phosphoric acid, nitric acid, acetic acid, glycolic acid, sodium dihydrogen phosphate, iminodiacetic acid, and water in the weight percent (wt %) ratio of about 60, about 3, about 12, about 1.0, about 2.0, about 2.0, and about 20. First, it turned out that the CuO/Cu layer was excellent in total etch time at about 61 sec. With the case of FIG. 4A based on EPD+ about 50%, it turned out that the CD skew of the CuO/Cu layer was fair at about 3.5 μm. With the case of FIG. 4B based on EPD+ about 70%, the CD skew of the CuO/Cu layer turned out to be about 4.5 μm, while with the case of FIG. 4C based on EPD+ about 90%, the CD skew thereof was about 5.0 μm, and with the case of FIG. 4D based on EPD+ about 110%, the CD skew was about 6.2 μm. Furthermore, with all the relevant cases, etching remnants were not found.

Figure 5A:
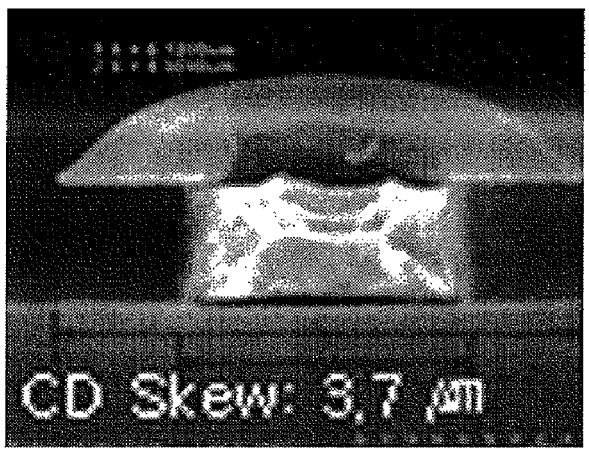
FIG. 5A to FIG. 5C are sectional SEM photographs of a Cu layer etched at 35° C. using an etchant composition according to Example 8.
Figure 5B:
Figure 5C:
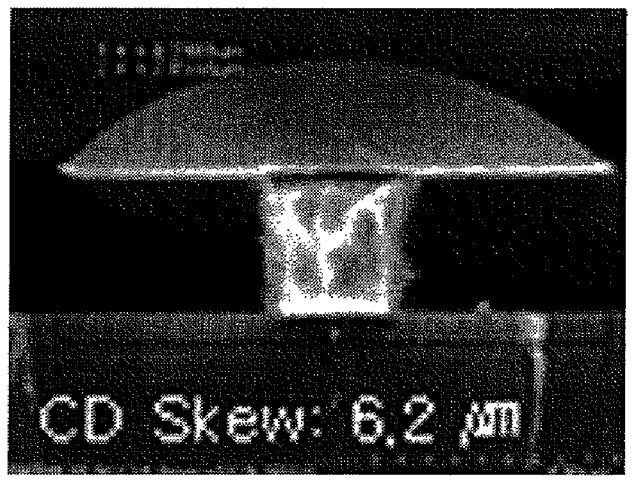
Figure 6A:
FIG. 6A to FIG. 6C are sectional SEM photographs of a CuO/Cu layer etched at 35° C. using an etchant composition according to Example 8.
Figure 6B:
Figure 6C:
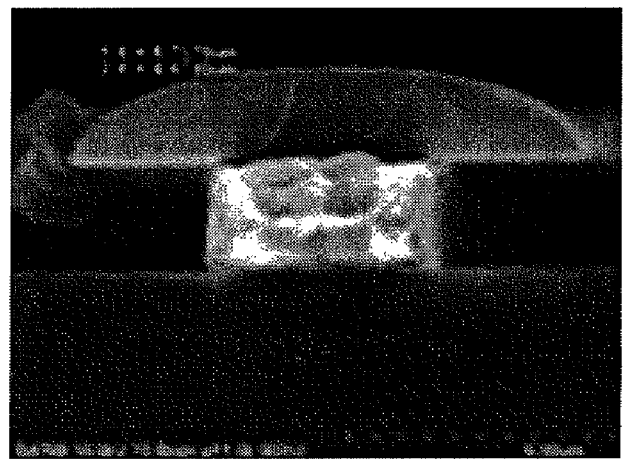
Figure 7A:
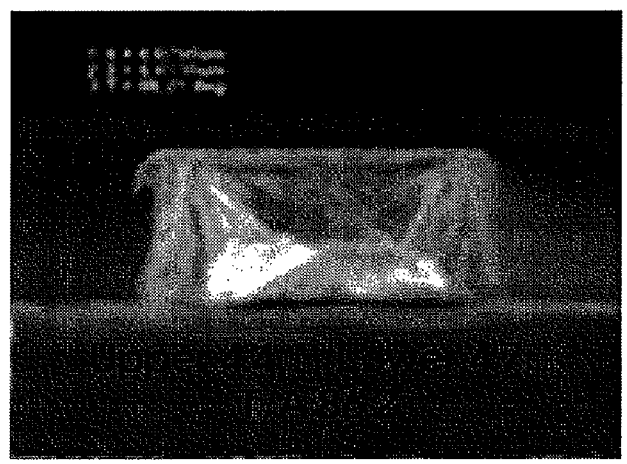
FIG. 7A to FIG. 7D are sectional SEM photographs of a Cu layer etched at 30° C. using an etchant composition according to Example 8 and processed through the removal of the overlying photoresist pattern.
Figure 7B:
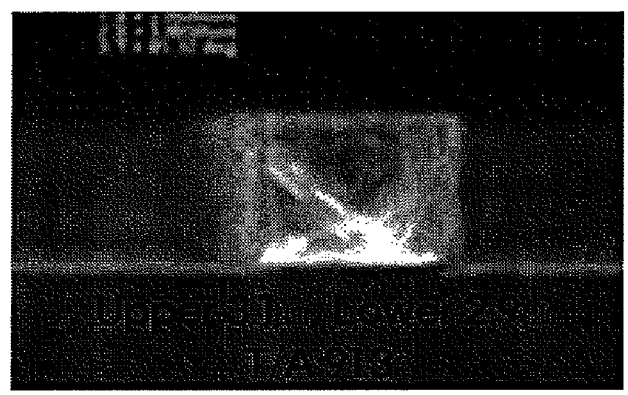
Figure 7C:
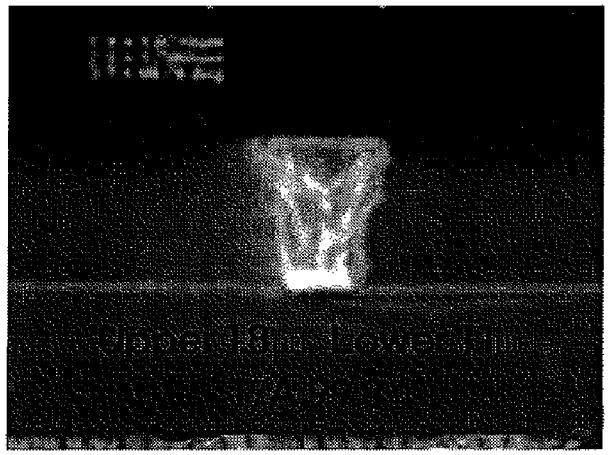
Figure 7D:
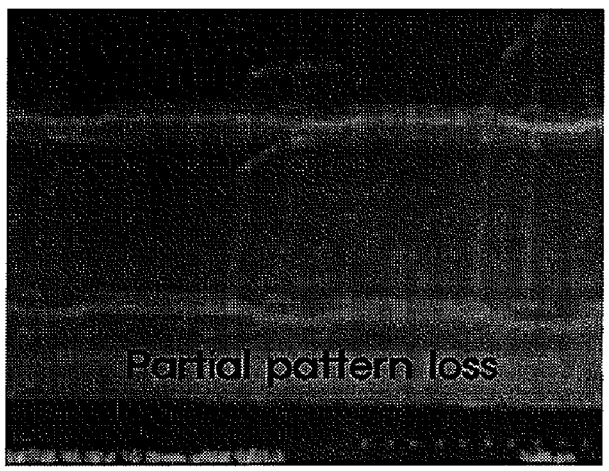
Figure 8A:
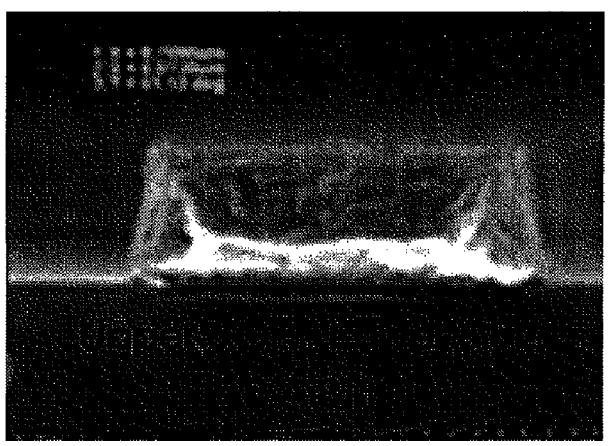
FIG. 8A to FIG. 8D are sectional SEM photographs of a CuO/Cu layer etched at 30° C. using an etchant composition according to Example 8 and processed through the removal of the overlying photoresist pattern.
Figure 8B:
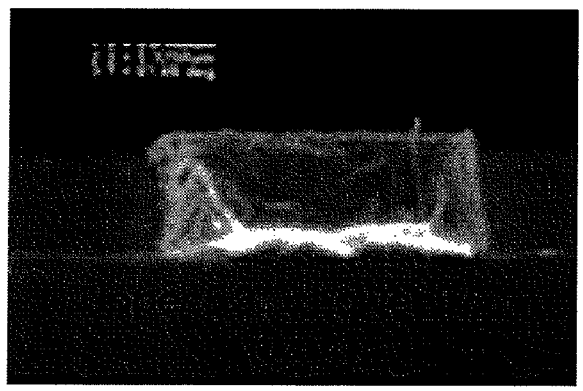
Figure 8C:
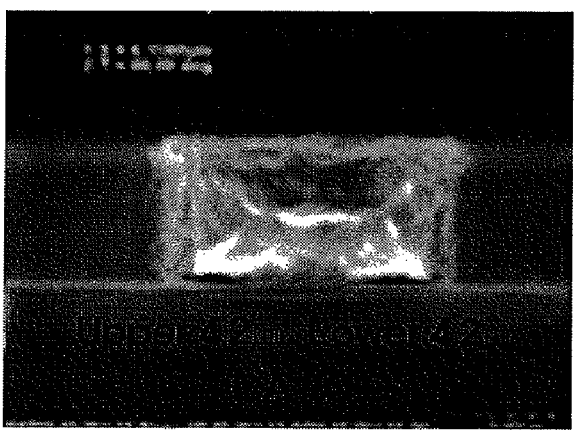
Figure 8D:
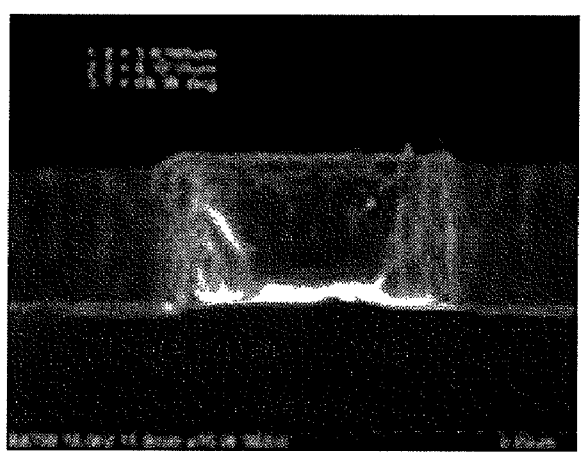
Figure 9A:
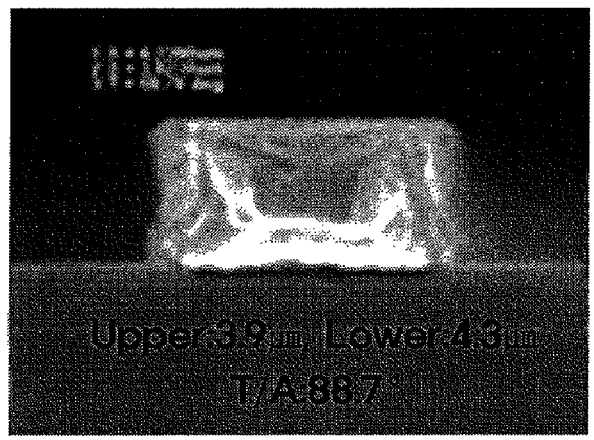
FIG. 9A to FIG. 9D are sectional SEM photographs of a Cu layer etched at 33° C. using an etchant composition according to Example 8 and processed through the removal of the overlying photoresist pattern.
Figure 9B:
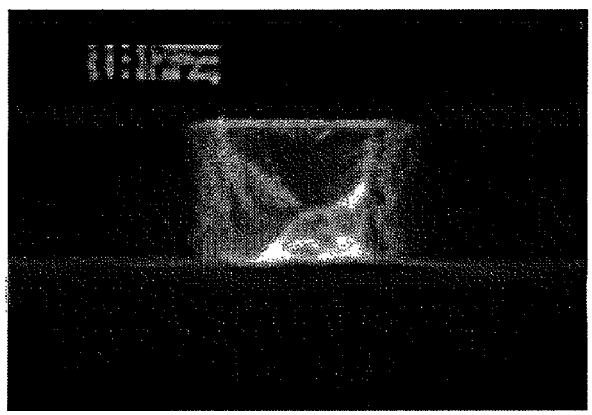
Figure 9C:
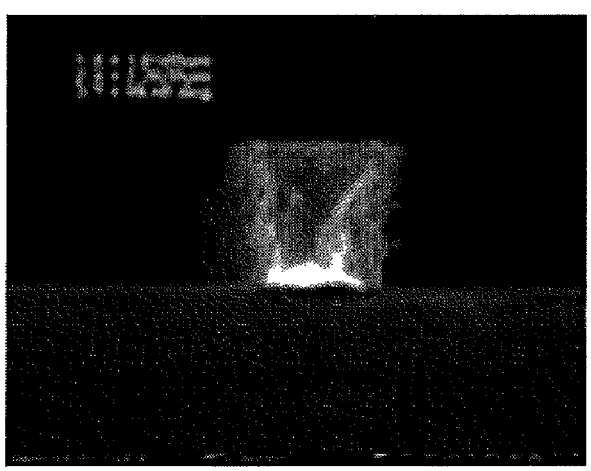
Figure 9D:
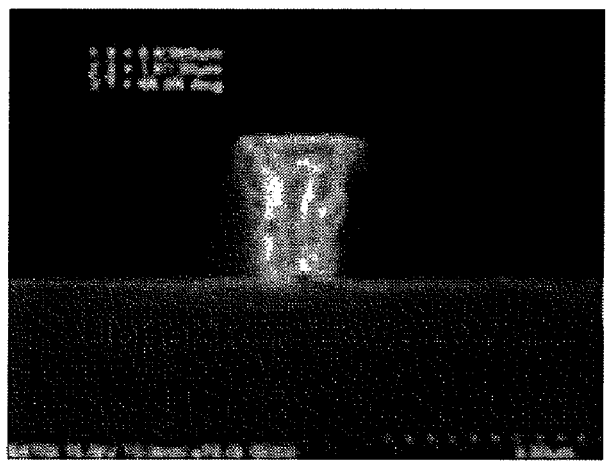
Figure 10A:
FIG. 10A to FIG. 10D are sectional SEM photographs of a CuO/Cu layer etched at 33° C. using an etchant composition according to Example 8 and processed through the removal of the overlying photoresist pattern.
Figure 10B:
Figure 10C:
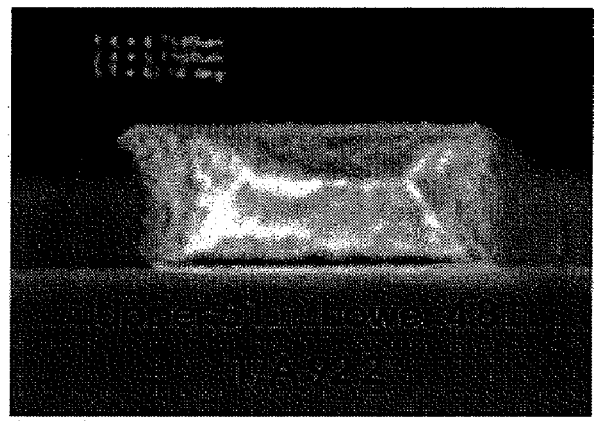
Figure 10D:
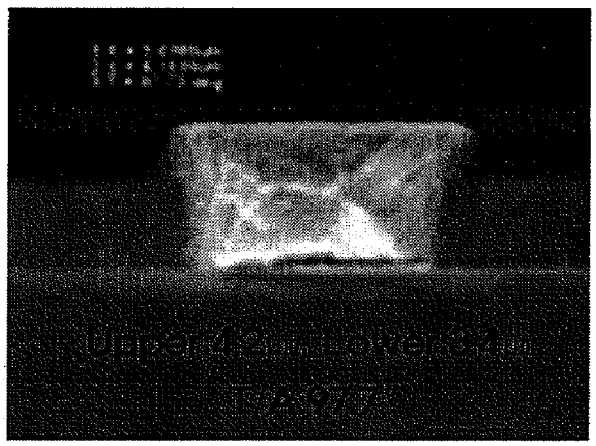

FIG. 5A to FIG. 5C are sectional SEM photographs of a Cu layer etched at about 35° C. by using an etchant composition according to Example 8, and FIG. 6A to FIG. 6C are sectional SEM photographs of a CuO/Cu layer etched at about 35° C. by using an etchant composition according to Example 8.

FIG. 5A to FIG. 5C illustrate the profiles of a Cu wiring layer after it was etched by using an etchant composition containing phosphoric acid, nitric acid, acetic acid, glycolic acid, sodium dihydrogen phosphate, iminodiacetic acid, and water in the weight percent (wt %) ratio of about 60, about 3, about 12, about 1.0, about 2.0, about 2.0, and about 20. First, it turned out that the Cu layer was excellent in EPD at about 56 sec. With the case of FIG. 5A based on EPD+ about 50%, it turned out that the CD skew of the Cu layer was fair at about 3.7 μm. With the case of FIG. 5B based on EPD+ about 70%, the CD skew of the Cu layer turned out to be about 4.8 μm, and with the case of FIG. 5C based on EPD+ about 90%, the CD skew thereof was about 6.2 μm. Furthermore, with all the relevant cases, etching remnants were not found.

FIG. 6A to FIG. 6C illustrate the profiles of a CuO/Cu wiring layer after it was etched by using an etchant composition containing phosphoric acid, nitric acid, acetic acid, glycolic acid, sodium dihydrogen phosphate, iminodiacetic acid, and water in the weight percent (wt %) ratio of about 60, about 3, about 12, about 1.0, about 2.0, about 2.0, and about 20. First, it turned out that the CuO/Cu layer was excellent in total etch time at about 56 sec. With the case of FIG. 6A based on EPD+ about 50%, it turned out that the CD skew of the CuO/Cu layer was good at about 2.4 μm. With the case of FIG. 6B based on EPD+ about 70%, the CD skew of the CuO/Cu layer was about 4.8 μm, and with the case of FIG. 6C based on EPD+ about 90%, the CD skew thereof was about 5.3 μm. Furthermore, with all the relevant cases, etching remnants were not found.

As the EPD increased, the CD skew was proportionally increased, and the CuO-contained double-layered pattern turned out to be smaller in CD skew than that of the Cu layer. No significant difference occurred in CD skew as a function of different temperatures, and etching remnants were not found throughout the entire structure.

As described above, it can be known from the sectional SEM photographs of the Cu layer and the CuO/Cu layer after the etching process that excellent profiles can be obtained in case the gate and data lines are etched using an etchant composition according to an exemplary embodiment of the present invention.

FIG. 7A to FIG. 12C are sectional SEM photographs of a Cu layer and a CuO/Cu layer after the etching process was completed and the overlying photoresist pattern was removed therefrom.

FIG. 7A to FIG. 7D are sectional SEM photographs of a Cu layer etched at about 30° C. by using an etchant composition according to Example 8 and processed through the removal of the overlying photoresist pattern, and FIG. 8A to FIG. 8D are sectional SEM photographs of a CuO/Cu layer etched at about 30° C. by using an etchant composition according to Example 8 and processed through the removal of the overlying photoresist pattern.

FIG. 7A to FIG. 7D illustrate the profiles of a Cu wiring layer after it was etched by using an etchant composition containing phosphoric acid, nitric acid, acetic acid, glycolic acid, sodium dihydrogen phosphate, iminodiacetic acid, and water in the weight percent (wt %) ratio of about 60, about 3, about 12, about 1.0, about 2.0, about 2.0, and about 20, and the overlying photoresist pattern was removed therefrom. First, it turned out that the Cu layer was good in EPD at about 73 sec. With the case of FIG. 7A based on EPD+ about 50%, it turned out that the upper-sided CD skew, the lower-sided CD skew, the taper angle of the Cu layer were excellent at about 4.4 μm, about 4.7 μm, and about 86.2 degrees, respectively. With the case of FIG. 7B based on EPD+ about 70%, the upper-sided CD skew, the lower-sided CD skew, and the taper angle of the Cu layer turned out to be about 3.1 μm, about 2.9 μm, and about 91.3 degrees, respectively, and with the case of FIG. 7C based on EPD+ about 90%, the upper-sided CD skew, the lower-sided CD skew, and the taper angle of the Cu layer were about 1.8 μm, about 1.1 μm, and about 99.8 degrees. With the case of FIG. 7D based on EPD+ about 110%, the pattern was partially destroyed, and hence a measurement could not be conducted. Furthermore, with all the relevant cases, etching remnants were not found.

FIG. 8A to FIG. 8D illustrate the profiles of a CuO/Cu wiring layer after it was etched by using an etchant composition containing phosphoric acid, nitric acid, acetic acid, glycolic acid, sodium dihydrogen phosphate, iminodiacetic acid, and water in the weight percent (wt %) ratio of about 60, about 3, about 12, about 1.0, about 2.0, about 2.0, and about 20, and the overlying photoresist pattern was removed therefrom. First, it turned out that the CuO/Cu layer was excellent in EPD at about 69 sec. With the case of FIG. 8A based on EPD+ about 50%, it turned out that the upper-sided CD skew, the lower-sided CD skew, and the taper angle of the CuO/Cu layer were excellent to be about 6.0 μm, about 6.8 μm, and about 81.1 degrees, respectively. With the case of FIG. 8B based on EPD+ about 70%, the upper-sided CD skew, the lower-sided CD skew, and the taper angle of the CuO/Cu layer turned out to be about 5.3 μm, about 5.6 μm, and about 81.5 degrees, respectively, while with the case of FIG. 8C based on EPD+ about 90%, the upper-sided CD skew, the lower-sided CD skew, and the taper angle thereof were about 4.2 µm, about 4.2 µm, and about 90.0 degrees, respectively, and with the case of FIG. 8D based on EPD+ about 110%, the upper-sided CD skew, the lower-sided CD skew, and the taper angle thereof were about 4.1 µm, about 3.9 µm, and about 89.4 degrees, respectively. With all the relevant cases, etching remnants were not found.

FIG. 9A to FIG. 9D are sectional SEM photographs of a Cu layer after it was etched at about 33° C. by using an etchant composition according to Example 8 and the overlying photoresist pattern was removed therefrom, and FIG. 10A to FIG. 10D are sectional SEM photographs of a CuO/Cu layer after it was etched at about 33° C. by using an etchant composition according to Example 8 and the overlying photoresist pattern was removed therefrom.

FIG. 9A to FIG. 9D illustrate the profiles of a Cu wiring layer after it was etched by using an etchant composition containing phosphoric acid, nitric acid, acetic acid, glycolic acid, sodium dihydrogen phosphate, iminodiacetic acid, and water in the weight percent (wt %) ratio of about 60, about 3, about 12, about 1.0, about 2.0, about 2.0, and about 20, and the overlying photoresist pattern was removed therefrom. First, it turned out that the Cu layer was excellent in EPD at about 62 sec. With the case of FIG. 9A based on EPD+ about 50%, it turned out that the upper-sided CD skew, the lower-sided CD skew, and the taper angle of the Cu layer were excellent at about 3.9 µm, about 4.3 µm, and about 88.7 degrees, respectively. With the case of FIG. 9B based on EPD+ about 70%, the upper-sided CD skew, the lower-sided CD skew, and the taper angle of the Cu layer turned out to be about 3.0 µm, about 2.7 µm, and about 93.9 degrees, respectively, while with the case of FIG. 9C based on EPD+ about 90%, the upper-sided CD skew, the lower-sided CD skew, and the taper angle thereof were about 2.3 µm, about 1.6 µm, and about 99.5 degrees, and with the case of FIG. 9D based on EPD+ about 110%, the upper-sided CD skew, the lower-sided CD skew, and the taper angle thereof were about 1.6 µm, about 0.9 µm, and about 99.0 degrees, respectively. With all the relevant cases, etching remnants were not found.

FIG. 10A to FIG. 10D illustrate the profiles of a CuO/Cu wiring layer after it was etched by using an etchant composition containing phosphoric acid, nitric acid, acetic acid, glycolic acid, sodium dihydrogen phosphate, iminodiacetic acid, and water in the weight percent (wt %) ratio of about 60, about 3, about 12, about 1.0, about 2.0, about 2.0, and about 20, and the overlying photoresist pattern was removed therefrom. First, it turned out that the CuO/Cu layer was excellent in total etch time at about 61 sec. With the case of FIG. 10A based on EPD+ about 50%, it turned out that the upper-sided CD skew, the lower-sided CD skew, and the taper angle of the CuO/Cu layer were excellent at about 5.6 µm, about 5.9 µm, and about 88.3 degrees, respectively. With the case of FIG. 10B based on EPD+ about 70%, the upper-sided CD skew, the lower-sided CD skew, and the taper angle of the CuO/Cu layer turned out to be about 5.5 µm, about 5.2 µm, and about 92.2 degrees, respectively, while with the case of FIG. 10C based on EPD+ about 90%, the upper-sided CD skew, the lower-sided CD skew, and the taper angle thereof were about 5.1 µm, about 4.8 µm, and about 92.2 degrees, and with the case of FIG. 10D based on EPD+ about 110%, the upper-sided CD skew, the lower-sided CD skew, and the taper angle thereof were about 4.2 µm, about 3.4 µm, and about 97.7 degrees, respectively. With all the relevant cases, etching remnants were not found.

Figure 11A:
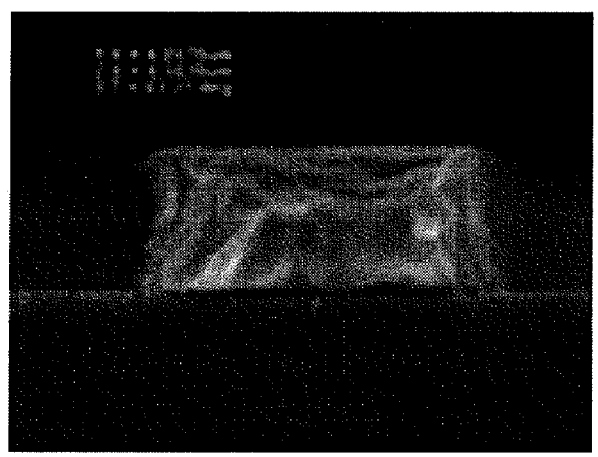
FIG. 11A to FIG. 11C are sectional SEM photographs of a Cu layer etched at 35° C. using an etchant composition according to Example 8 and processed through the removal of the overlying photoresist pattern.
Figure 11B:
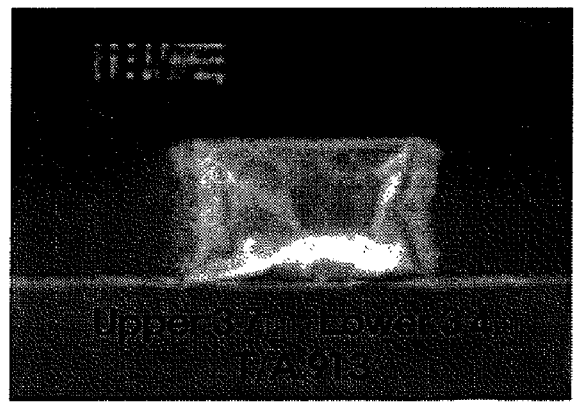
Figure 11C:
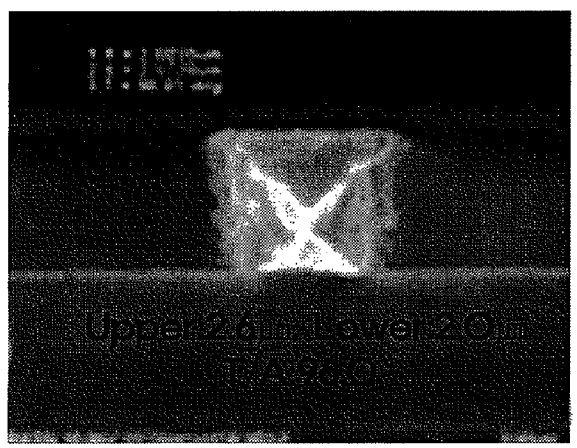
Figure 12A:
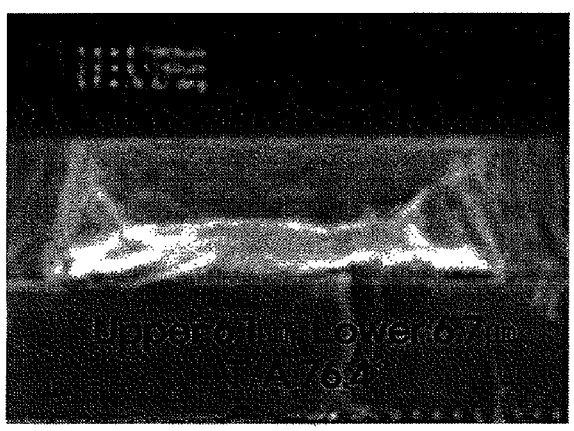
FIG. 12A to FIG. 12C are sectional SEM photographs of a CuO/Cu layer etched at 35° C. using an etchant composition according to Example 8 and processed through the removal of the overlying photoresist pattern.
Figure 12B:
Figure 12C:
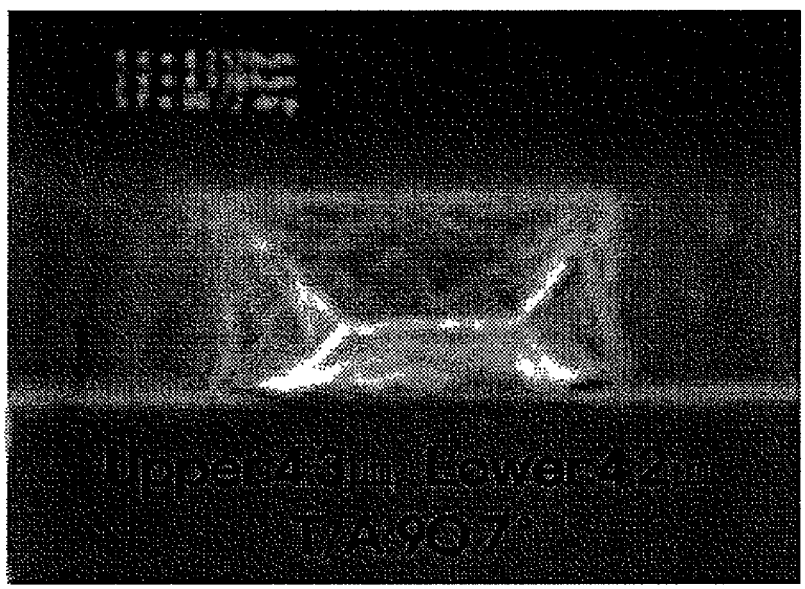

FIG. 11A to FIG. 11C are sectional SEM photographs of a Cu layer after it was etched at about 35° C. by using an etchant composition according to Example 8 and the overlying photoresist pattern was removed therefrom, and FIG. 12A to FIG. 12C are sectional SEM photographs of a CuO/Cu layer after it was etched at about 35° C. by using an etchant composition according to Example 8 and the overlying photoresist pattern was removed therefrom.

FIG. 11A to FIG. 11C illustrate the profiles of a Cu wiring layer after it was etched by using an etchant composition containing phosphoric acid, nitric acid, acetic acid, glycolic acid, sodium dihydrogen phosphate, iminodiacetic acid, and water in the weight percent (wt %) ratio of about 60, about 3, about 12, about 1.0, about 2.0, about 2.0, and about 20, and the overlying photoresist pattern was removed therefrom. First, it turned out that the Cu layer was excellent in EPD at about 56 sec. With the case of FIG. 11A based on EPD+ about 50%, it turned out that the upper-sided CD skew, the lower-sided CD skew, and the taper angle of the Cu layer were excellent to be about 4.3 µm, about 4.9 µm, and about 83.2, respectively. With the case of FIG. 11B based on EPD+ about 70%, the upper-sided CD skew, the lower-sided CD skew, and the taper angle of the Cu layer turned out to be about 3.7 µm, about 3.4 µm, and about 91.3 degrees, respectively, and with the case of FIG. 11C based on EPD+ about 90%, the upper-sided CD skew, the lower-sided CD skew, and the taper angle of the Cu layer were about 2.6 µm, about 2.0 µm, and about 96.0 degrees, respectively. With all the relevant cases, etching remnants were not found.

FIG. 12A to FIG. 12C illustrate the profiles of a CuO/Cu wiring layer after it was etched by using an etchant composition containing phosphoric acid, nitric acid, acetic acid, glycolic acid, sodium dihydrogen phosphate, iminodiacetic acid, and water in the weight percent (wt %) ratio of about 60, about 3, about 12, about 1.0, about 2.0, about 2.0, and about 20, and the overlying photoresist pattern was removed therefrom. First, it turned out that the CuO/Cu layer was excellent in total etch time at about 56 sec. With the case of FIG. 12A based on EPD+ about 50%, it turned out that the upper-sided CD skew, the lower-sided CD skew, and the taper angle of the CuO/Cu layer were excellent at about 6.1 µm, about 6.7 µm, and about 76.4 degrees, respectively. With the case of FIG. 12B based on EPD+ about 70%, the upper-sided CD skew, the lower-sided CD skew, and the taper angle of the CuO/Cu layer turned out to be about 5.1 µm, about 4.7 µm, and about 95.8 degrees, respectively, and with the case of FIG. 12C based on EPD+ about 90%, the upper-sided CD skew, the lower-sided CD skew, and the taper angle of the CuO/Cu layer were about 4.3 µm, about 4.2 µm, and about 90.7 degrees, respectively. With all the relevant cases, etching remnants were not found.

As the EPD increased, the CD skew was proportionally increased, and the CuO-contained double-layered pattern turned out to be smaller in taper angle than that of the Cu layer. No significant difference in CD skew occurred as a function of different temperatures, and etching remnants were not found throughout the entire structure.

As described above, it can be known from the sectional SEM photographs of the Cu layer and the CuO/Cu layer after the etching process was completed and the overlying photoresist pattern was removed therefrom that excellent profiles can be obtained in case the gate and data lines are etched using an etchant composition according to an exemplary embodiment of the present invention.

Comparative Examples

With comparative examples, experiments were undertaken under the same conditions as those related to the examples except that the etchant composition was differentiated from that of the examples.

A substrate based on a glass material with a size of about 300× about 400 mm was prepared, and metal layers containing copper or a copper alloy were deposited onto the substrate as gate and data lines.

An etchant composition of about 180 kg containing phosphoric acid ($H_3PO_4$), nitric acid ($HNO_3$), acetic acid ($CH_3COOH$), glycolic acid, sodium dihydrogen phosphate, iminodiacetic acid, and water in accordance with the composition ratios listed in Table 2 was prepared. The etchant composition was put into experimental spray etching equipment (manufactured by K. C Tech Company, model ETCHER (TFT)), and the etching process was conducted at about 30° C., about 33° C., and about 35° C. The total etch time was established such that the time detected by an end point detector (EPD) was added by the amount of about 50%, about 70%, about 90%, and about 110%, respectively. The substrate was put into the etching equipment and sprayed. When the etching with respect to the gate and the data lines was completed, the substrate was taken out and cleaned by deionized water. The etching profile was observed by a scanning electronic microscope (SEM, manufactured by HITACHI Company, model S-4700), and the total etch time detected by the end point detector (for convenience, referred to hereinafter simply as EPD), the one-sided critical dimension loss (for convenience, referred to hereinafter simply as CD skew), and the presence or absence of remnants after the etching were evaluated. Thereafter, the substrate was dried by using a hot air dryer, and the photoresist was stripped by using a photoresist stripper. After the cleaning and the drying, the etching profile was again observed, and the EPD, the CD skew, the taper angle, and the presence or absence of remnants after the etching were evaluated.

((Etching characteristic result standard))

⊚ (Excellent): EPD≦about 70 sec, CD skew≦about 2 μm, Taper angle=about 70-about 90 degrees ○ (Good): EPD≦about 75 sec, CD skew≦about 3 μm, Taper angle=about 60-about 70 degrees Δ(Fair): EPD≦about 80 sec, CD skew≦about 4 μm, Taper angle=about 50-about 60 degrees x (Poor): EPD≦about 80 sec, CD skew>about 4 μm, Taper angle<about 50 degrees The results based on the above-identified standards are listed in Table 2.

difficulty in applying the etchant compositions according to the comparative examples for use with the practical etching process.

A method of fabricating a liquid crystal display using an etchant composition according to an exemplary embodiment of the present invention will now be described. However, the present invention is not limited to the liquid crystal display, but may be applied for use in fabricating other kinds of display devices such as an organic electroluminescence device, a plasma display device, and an electrophoretic display.

A method of fabricating a thin film transistor array panel using an etchant composition according to an exemplary embodiment of the present invention will now be described in detail.

Figure 13:
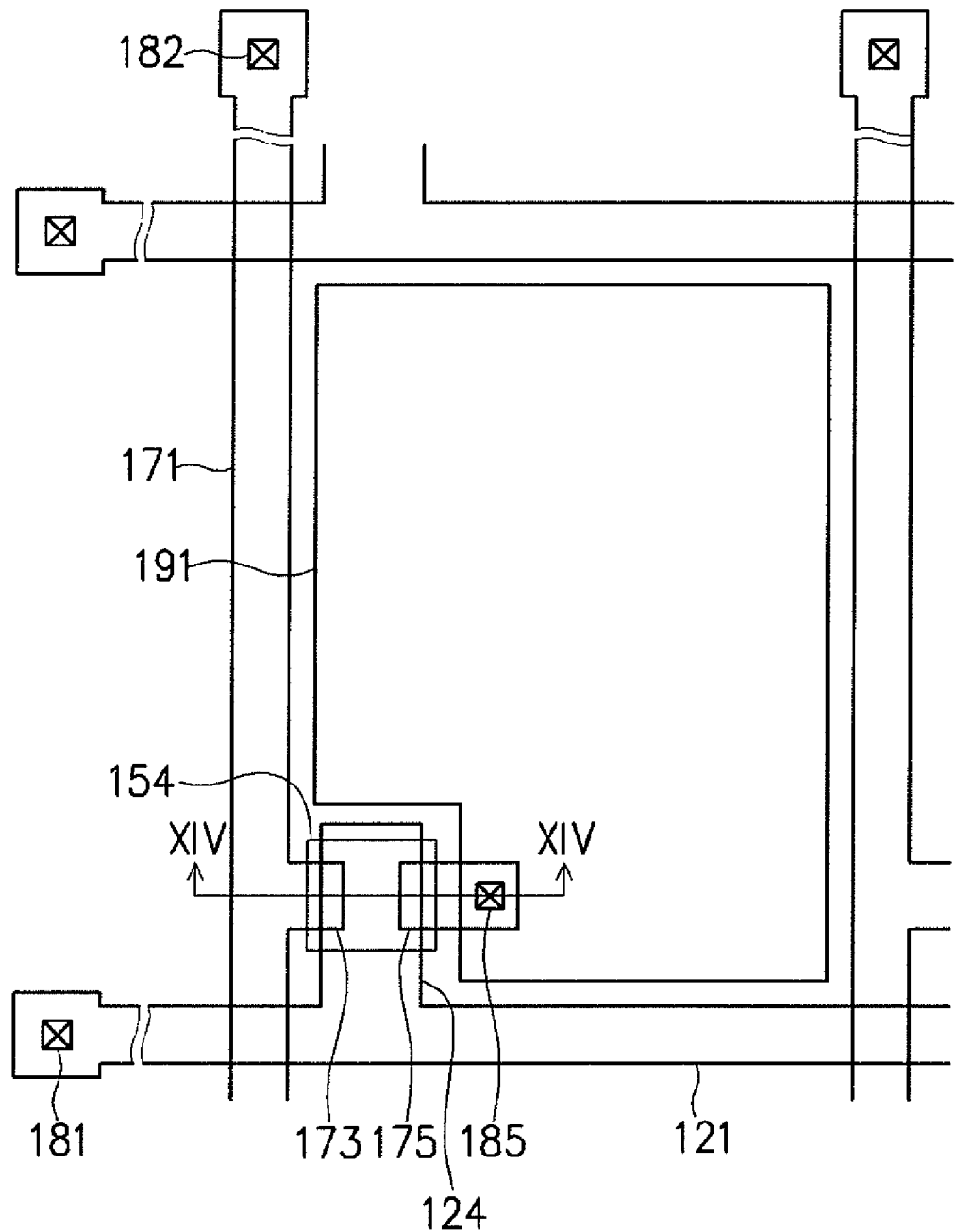
FIG. 13 is a layout view of a thin film transistor array panel for a liquid crystal display according to an exemplary embodiment of the present invention.
Figure 14:
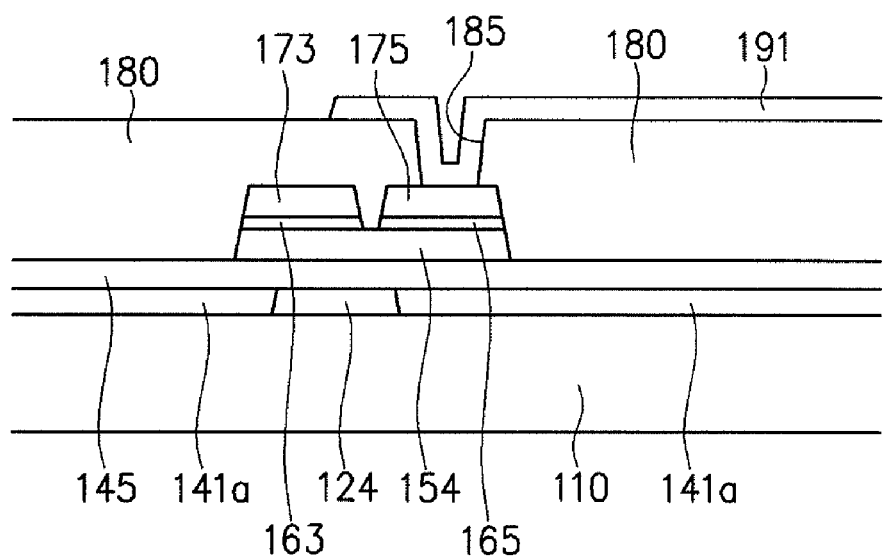
FIG. 14 is a cross-sectional view of the thin film transistor array panel taken along the XIV-XIV line of FIG. 13.

FIG. 13 is a layout view of a thin film transistor array panel for a liquid crystal display according to an exemplary embodiment of the present invention, and FIG. 14 is a cross-sectional view of the thin film transistor array panel taken along the XIV-XIV line of FIG. 13.

A plurality of gate lines 121 are formed on an insulation substrate 110 to transmit gate signals. The gate lines 121 proceed in the horizontal direction, and each partially forms a plurality of gate electrodes 124.

The gate lines 121 may be formed with aluminum-based metals such as, for example, aluminum (Al) and aluminum alloys, silver-based metals such silver (Ag) and silver alloys, copper-based metals such as copper (Cu) and copper alloys, molybdenum-based metals such as molybdenum (Mo) and molybdenum alloys, chromium (Cr), tantalum (Ta), or titanium (Ti). The gate lines 121 may have a multi-layered structure with two conductive layers that differ in physical properties from each other. With the present exemplary embodiment, the gate lines 121 contain, for example, a copper oxide (CuO) selected from copper-based metals such as copper (Cu) and copper alloys.

Referring to FIG. 14, over-coat films 141a are formed on the insulation substrate 110 at both sides of the gate electrode 124, and are overlaid with a gate insulating layer 145. A semiconductor island 154 and ohmic contacts 163 and 165 are sequentially formed on the gate insulating layer 145. A

TABLE 2

| | Composition (wt %) | | | | | | | Etching characteristic result | | | |
| --- | --- | --- | --- | --- | --- | --- | --- | --- | --- | --- | --- |
| Comp. Ex. | Phosphoric acid | Nitric acid | Acetic acid | Glycolic acid | Sodium dihydrogen phosphate | Iminodiacetic acid | Water | EPD | CD skew | Taper angle | Remnants |
| 1 | 74 | 2 | 8 | 2 | 0.5 | 1 | 12.5 | | Pattern loss | | |
| 2 | 68 | 2 | 10 | 7 | 1 | 2 | 10 | | Pattern loss | | |
| 3 | 50 | 3 | 15 | 2 | 2 | 7 | 21 | X | Partially non-etched | | |
| 4 | 48 | 7 | 10 | 1.5 | 7 | 2 | 24.5 | X | Partially non-etched | | |
| 5 | 38 | 2 | 25 | 3 | 0.5 | 1 | 30.5 | | Non-etched | | |

(Comp. Ex.: Comparative Example)

It can be known from Table 2 that when a plurality of metal layers were collectively etched by using etchant compositions according to the comparative examples, there were cases exhibiting poor etching characteristics in which the EPD was not detected, or the pattern was destroyed or partially non-etched. Accordingly, differing from that according to an exemplary embodiment of the present invention, there is a plurality of data lines 171 and a plurality of drain electrodes 175 are formed on the ohmic contacts 163 and 165 and the gate insulating layer 145.

The data lines 171 proceed in the vertical direction, and cross the gate lines 121 so as to transmit data voltages. A plurality of branches are protruded from the respective data lines 171 toward the drain electrodes 175 so as to form source electrodes 173. A pair of a source electrode 173 and a drain electrode 175 that are separated from each other are placed opposite to each other while centering around a gate electrode 124.

The data lines 171 with the source electrodes 173, and the drain electrodes 175 are preferably formed with refractory metals such as, for example, molybdenum, chromium, tantalum, and titanium, or alloys thereof, and may have a multi-layered structure with a refractory metal-based layer and a low resistance conductive layer. For example, the multi-layered structure may be a double-layered structure with a chromium or molybdenum (alloy)-based lower layer and an aluminum (alloy)-based upper layer, or a triple-layered structure with a molybdenum (alloy)-based lower layer, an aluminum (alloy)-based middle layer, and a molybdenum (alloy)-based upper layer. Furthermore, the data lines 171 and the drain electrodes 175 may be formed with various other metals or conductors. With the present exemplary embodiment, the data lines 171 contain, for example, copper oxide (CuO) selected from copper-based metals such as copper (Cu) and copper alloys. A passivation layer 180 with contact holes 185 is formed on the data lines 171, and is overlaid with pixel electrodes 191.

The gate electrode 124, the source electrode 173, and the drain electrode 175 form a thin film transistor (TFT) in association with the semiconductor island 154, and the channel of the thin film transistor is formed at the semiconductor island 154 between the source and drain electrodes 173 and 175.

Now, a method of fabricating the thin film transistor array panel shown in FIG. 13 and FIG. 14 according to an exemplary embodiment of the present invention will be described with reference to FIG. 15 to FIG. 24 in detail.

FIG. 15 to FIG. 24 are cross-sectional views sequentially illustrating the process of fabricating the thin film transistor array panel shown in FIG. 13 and FIG. 14.

Figure 15:
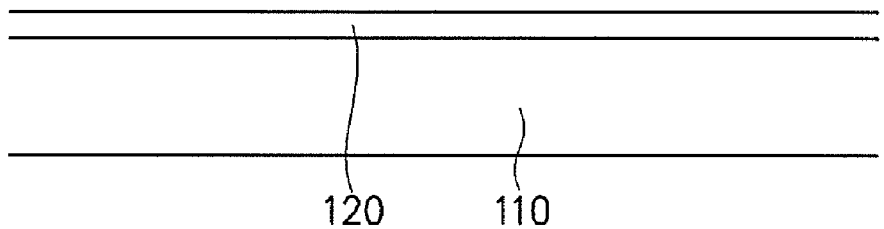
FIG. 15 to FIG. 23 are cross-sectional views sequentially illustrating the process of fabricating the thin film transistor array panel shown in FIG. 13 and FIG. 14.

First, as shown in FIG. 15, a first metal layer 120 is deposited onto an insulation substrate 110 such that, for example, it has a single-layered or multi-layered structure with the contents of copper or a copper oxide.

Figure 16:
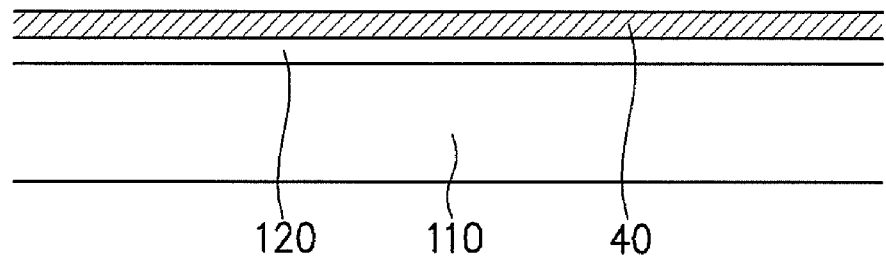

Thereafter, as shown in FIG. 16, a first photoresist film 40 is coated onto the first metal layer 120 and exposed to light by using a mask with light transmission and interception parts, followed by being developed.

Figure 17:
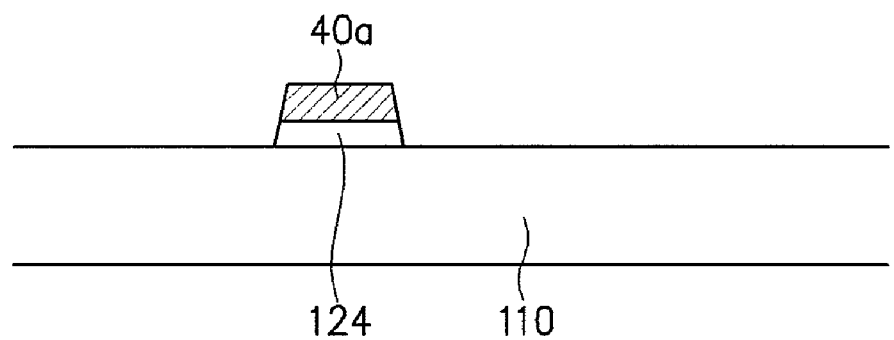

As shown in FIG. 17, the first metal layer 120 is etched all at once except for the portion thereof that is overlaid with a first photoresist pattern 40a so as to form gate lines 121 with gate electrodes 124. At this time, the etching is conducted using an etchant composition according to an exemplary embodiment of the present invention.

Figure 18:
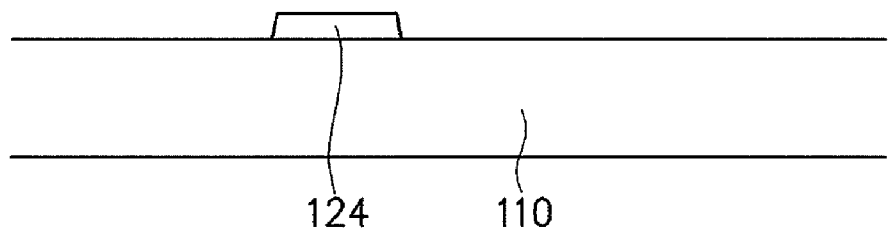

Then, as shown in FIG. 18, the first photoresist pattern 40a is stripped using, for example, a photoresist stripper.

Figure 19:
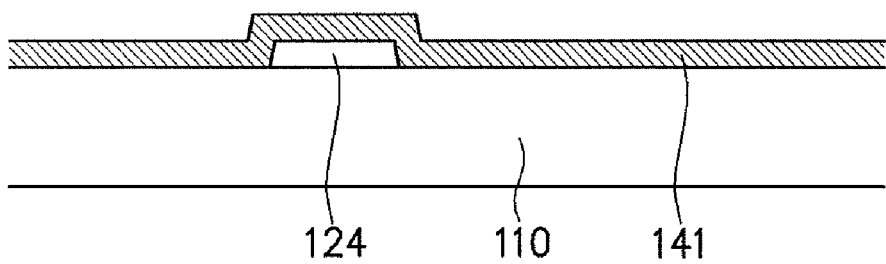
Figure 20:
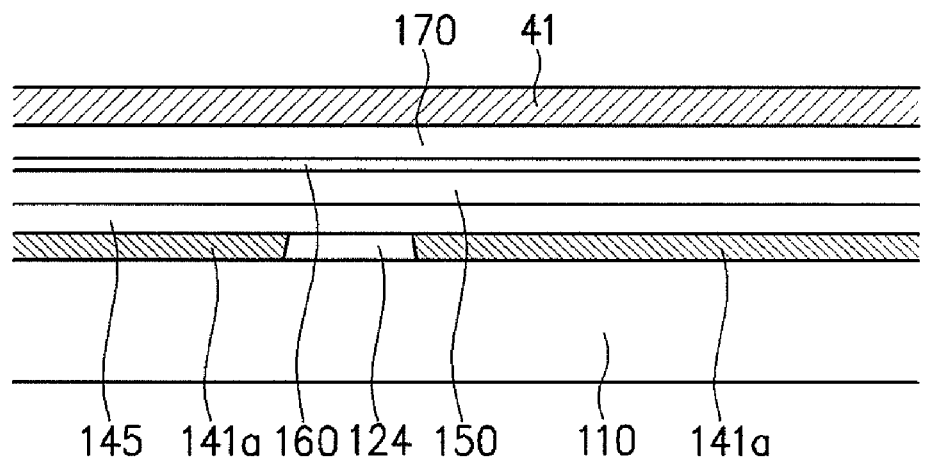

As shown in FIG. 19, a second photoresist film 141 is coated onto the gate electrode 124, and exposed to light illuminated from the rear of the insulating substrate 110, followed by being developed and heat-treated, so as to form first over-coat films 141a at both sides of the gate electrode 124, as shown in FIG. 20. Thereafter, a gate insulating layer 145, an amorphous silicon-based intrinsic semiconductor layer 150, an extrinsic semiconductor layer 160 based on n-type impurity-doped amorphous silicon, and a second metal layer 170 having, for example, a single-layered or multi-layered structure with the contents of copper or a copper oxide are sequentially deposited onto the gate electrode 124 and the first over-coat films 141a.

Figure 21:
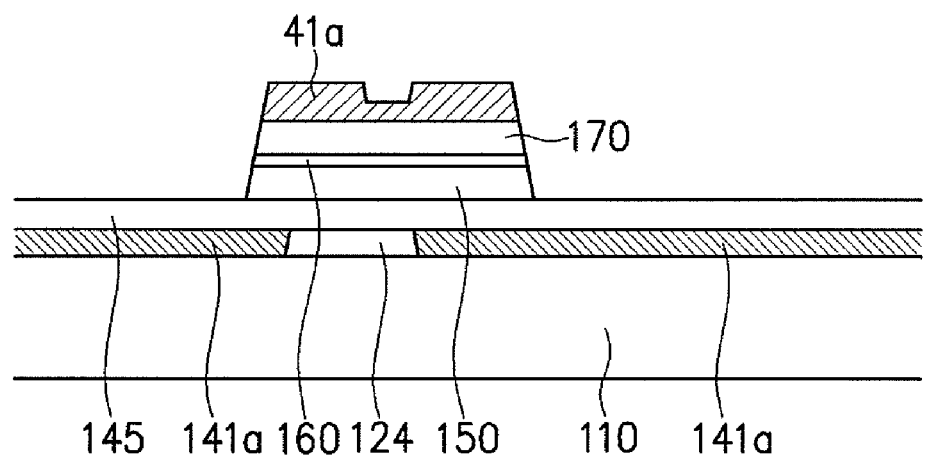

As shown in FIG. 21, a third photoresist film 41 is coated onto the second metal layer 170, and exposed to light using a mask with light transmission, interception, and semi-transmission parts, followed by being developed, so as to form a third photoresist pattern 41a that is differentiated in thickness such that it has a large thickness in portions thereof to be formed with a data line 171 and source and drain electrodes 173 and 175, and a small thickness in portions thereof between the source and drain electrodes 173 and 175. Thereafter, the second metal layer 170 is etched all at once using the third photoresist pattern 41a as a mask. At this time, the etching is also conducted using an etchant composition according to an exemplary embodiment of the present invention. Then, the extrinsic semiconductor layer 160 that is exposed through the removal of the second metal layer 170, and the underlying intrinsic semiconductor layer 150 are etched.

Figure 22:
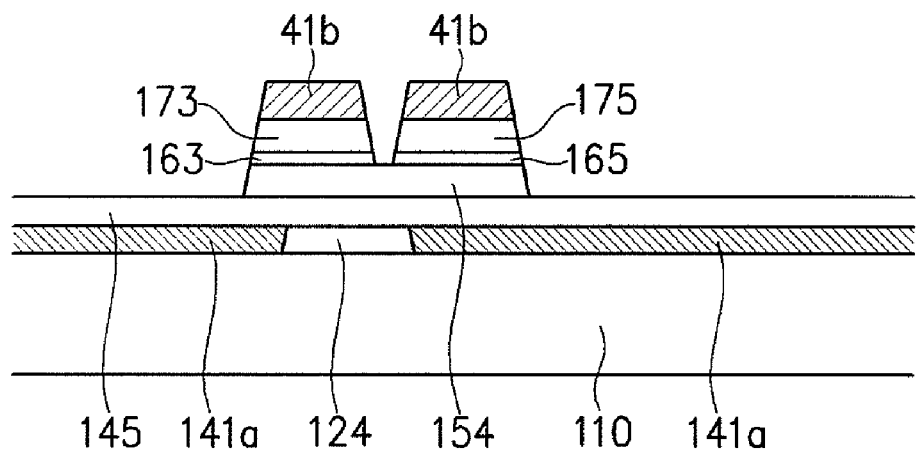

As shown in FIG. 22, ashing is conducted with respect to the third photoresist pattern 41a so as to form a fourth photoresist pattern 41b where the thin portions thereof between the source and the drain electrodes 173 and 175 are removed. The second metal layer 170 is etched using the fourth photoresist pattern 41b as a mask to thereby separate the source and drain electrodes 173 and 175 from each other. At this time, the etching is also conducted using an etchant composition according to an exemplary embodiment of the present invention. Thereafter, the extrinsic semiconductor layer 160 exposed through the removal of the second metal layer 170 is etched to thereby complete island-shaped ohmic contacts 163 and 165.

Figure 23:
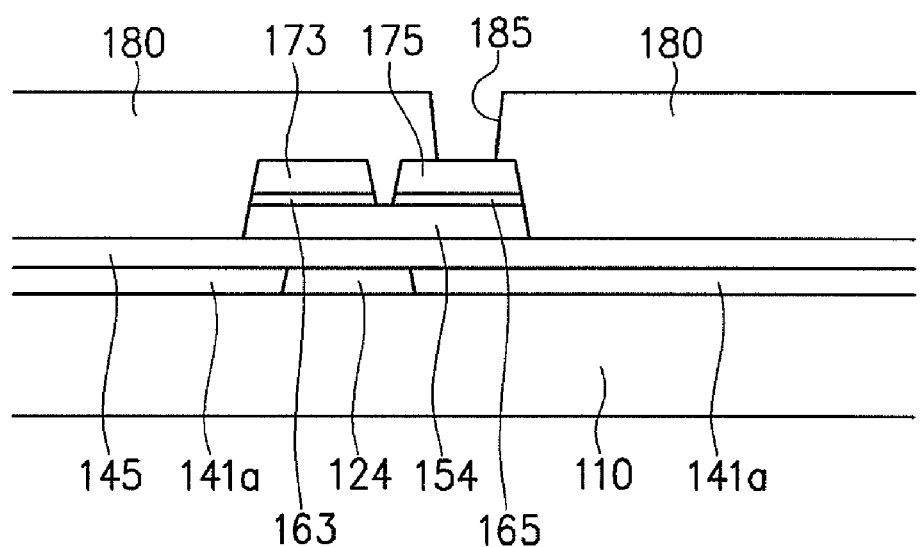

As shown in FIG. 23, the fourth photoresist pattern 41b is stripped using, for example, a photoresist stripper. A passivation layer 180 is then deposited onto the data line 171, and etched through photolithography to thereby form a contact hole 185, and a pixel electrode 191 on the passivation layer 180, as shown in FIG. 14.

Although it is illustrated with the present exemplary embodiment that the over-coat films 141a are formed at both sides of the gate line 121, such an over-coat film may be formed around the data line 171. Furthermore, a silicon nitride (SiNx)-based layer may be formed to secure the stability for the etchant composition before the formation of the gate line 121 or the data line 171. Meanwhile, although a thin film transistor array panel with a metal pattern is exemplified in this exemplary embodiment, an etchant composition according to an exemplary embodiment of the present invention is not limited thereto, and is applicable to all the metal patterns containing a copper alloy with the contents of copper or a copper oxide.

Having described the exemplary embodiments of the present invention, it is further noted that it is readily apparent to those of reasonable skill in the art that various modifications may be made without departing from the spirit and scope of the invention which defined by the metes and bounds of the appended claims

What is claimed is:

1. An etchant composition comprising about 40 to about 65 wt % of phosphoric acid, about 2 to about 5 wt % of nitric acid, about 2 to about 20 wt % of acetic acid, about 0.1 to about 2 wt % of a compound containing phosphate, about 0.1 to about 2 wt % of a compound simultaneously containing an amino group and a carboxyl group, and a remaining weight percent of water for the total weight of the etchant composition.

2. The etchant composition of claim 1 further comprising about 0.1 to about 2 wt % of an organic acid excluding acetic acid.

3. The etchant composition of claim 2, wherein the organic acid excluding acetic acid is at least one material selected from the group consisting of butanoic acid, citric acid, formic acid, gluconic acid, glycolic acid, malonic acid, oxalic acid, pentanoic acid, and a water-soluble organic acid excluding acetic acid.

4. The etchant composition of claim 2 further comprising at least one material selected from the group consisting of an etch control agent, a surfactant, a metal ion sequestering agent, a corrosion inhibitor, and a pH control agent.

5. The etchant composition of claim 2, wherein the water is deionized water.

6. The etchant composition of claim 2, wherein the compound containing phosphate is a material where one, two, or three hydrogen atoms in phosphoric acid are substituted by alkali metals or alkali earth metals.

7. The etchant composition of claim 6, wherein the compound containing phosphate is at least one material selected from the group consisting of sodium dihydrogen phosphate and potassium dihydrogen phosphate.

8. The etchant composition of claim 6, wherein the compound simultaneously containing an amino group and a carboxyl group is at least one material selected from an alanine-based compound, an aminobutyric acid-based compound, a glutamic acid-based compound, a glycine-based compound, an iminodiacetic acid-based compound, a nitrilotriacetic acid-based compound, and a sarcosine-based compound.

9. A method of forming a metal pattern, the method comprising the steps of:
depositing a metal layer comprising copper or a copper alloy;
forming a photoresist pattern on the metal layer;
etching the metal layer by using the photoresist pattern as a mask; and
removing the photoresist pattern,
wherein the step of etching the metal layer is conducted using an etchant composition comprising about 40 to about 65 wt % of phosphoric acid ($H_3PO_4$), about 2 to about 5 wt % of nitric acid ($HNO_3$), about 2 to about 20 wt % of acetic acid ($CH_3COOH$), about 0.1 to about 2 wt % of a compound containing phosphate, about 0.1 to about 2 wt % of a compound simultaneously containing an amino group and a carboxyl group, and a remaining weight percent of water for the total weight of the etchant composition.

10. The method of claim 9, wherein the etchant composition further comprises about 0.1 to about 2 wt % of an organic acid excluding acetic acid.

11. The method of claim 10, wherein the organic acid excluding acetic acid is at least one material selected from the group consisting of butanoic acid, citric acid, formic acid, gluconic acid, glycolic acid, malonic acid, oxalic acid, pentanoic acid, and a water-soluble organic acid excluding acetic acid.

12. The method of claim 10, wherein the compound simultaneously containing an amino group and a carboxyl group is at least one material selected from an alanine-based compound, an aminobutyric acid-based compound, a glutamic acid-based compound, a glycine-based compound, an iminodiacetic acid-based compound, a nitrilotriacetic acid-based compound, and a sarcosine-based compound.

13. The method of claim 10, wherein the etchant composition etches a single-layered structure based on copper or a copper alloy and a multi-layered structure of two or more layers based on the copper or copper alloy.

14. The method of claim 10, wherein the etchant composition further comprises at least one material selected from the group consisting of an etch control agent, a surfactant, a metal ion sequestering agent, a corrosion inhibitor, and a pH control agent.

15. The method of claim 10, wherein the water is deionized water.

16. The method of claim 10, wherein the compound containing phosphate is a material where one, two, or three hydrogen atoms in phosphoric acid are substituted by alkali metals or alkali earth metals.

17. The method of claim 16, wherein the compound containing phosphate is at least one material selected from the group consisting of sodium dihydrogen phosphate and potassium dihydrogen phosphate.

18. A method of fabricating a thin film transistor array panel, the method comprising the steps of:
forming gate lines on an insulation substrate;
forming data lines crossing the gate lines and having source electrodes, and drain electrodes facing the source electrodes;
forming a semiconductor layer around the source and drain electrodes; and
forming pixel electrodes contacting the drain electrodes,
wherein at least one of the steps of forming the gate lines and forming the data lines comprises the sub-steps of:
depositing a metal layer comprising copper or a copper alloy onto the insulation substrate; and
etching the metal layer by using an etchant composition comprising about 40 to about 65 wt % of phosphoric acid ($H_3PO_4$), about 2 to about 5 wt % of nitric acid ($HNO_3$), about 2 to about 20 wt % of acetic acid ($CH_3COOH$), about 0.1 to about 2 wt % of a compound containing phosphate, about 0.1 to about 2 wt % of a compound simultaneously containing an amino group and a carboxyl group, and a remaining weight percent of water for the total weight of the etchant composition.

19. The method of claim 18, wherein the step of forming the gate lines comprises the sub-steps of:
depositing a metal layer comprising copper or a copper alloy onto the insulation substrate;
etching the metal layer by using an etchant composition comprising about 40 to about 65 wt % of phosphoric acid ($H_3PO_4$), about 2 to about 5 wt % of nitric acid ($HNO_3$), about 2 to about 20 wt % of acetic acid ($CH_3COOH$), about 0.1 to about 2 wt % of a compound containing phosphate, about 0.1 to about 2 wt % of a compound simultaneously containing an amino group and a carboxyl group, and a remaining weight percent of water for the total weight of the etchant composition, thereby forming the gate lines or the data lines;
coating a photoresist film onto the gate lines;
exposing the photoresist film to light illuminated from the rear of the insulation substrate by using the metal layer as a mask, and developing the etched photoresist film to thereby form a photoresist pattern; and
applying heat or light to the photoresist pattern.

20. The method of claim 19, wherein the etchant composition further comprises about 0.1 to about 2 wt % of an organic acid excluding acetic acid.

* * * * *